United States Patent [19]

Cheng

[11] Patent Number: 5,847,965
[45] Date of Patent: Dec. 8, 1998

[54] METHOD FOR AUTOMATIC ITERATIVE AREA PLACEMENT OF MODULE CELLS IN AN INTEGRATED CIRCUIT LAYOUT

[75] Inventor: Chih-liang Eric Cheng, Milpitas, Calif.

[73] Assignee: Avant! Corporation, Fremont, Calif.

[21] Appl. No.: 691,607

[22] Filed: Aug. 2, 1996

[51] Int. Cl.[6] .................................................... G06F 17/50
[52] U.S. Cl. ........................... 364/488; 364/489; 364/491
[58] Field of Search .................................... 364/488, 489, 364/490, 491

[56] References Cited

U.S. PATENT DOCUMENTS

| | | | |
|---|---|---|---|
| 3,617,714 | 11/1971 | Kernighan et al. | 364/488 |
| 4,593,363 | 6/1986 | Burstein et al. | 364/491 |
| 4,908,772 | 3/1990 | Chi | 364/491 |
| 5,224,056 | 6/1993 | Chene et al. | 364/490 |
| 5,311,443 | 5/1994 | Crain et al. | 364/491 |
| 5,495,419 | 2/1996 | Rostoker et al. | 364/468 |
| 5,513,124 | 4/1996 | Trimberger et al. | 364/491 |
| 5,557,533 | 9/1996 | Koford et al. | 364/491 |
| 5,587,923 | 12/1996 | Wang | 364/490 |

OTHER PUBLICATIONS

Breuer, "Min–Cut Placement," Journal of Design Automation & Fault Tolerant Computing, vol. 1, No. 4, Oct. 1977, pp. 343–362.

Fiduccia et al., "A Linear–Time Heuristic for Improving Network Partitions," 19th Design Automation Conference, Jun. 1982, pp. 175–181.

*Primary Examiner*—Kevin J. Teska
*Assistant Examiner*—Leigh Marie Garbowski
*Attorney, Agent, or Firm*—Thomas E. Schatzel; Law Offices of Thomas E. Schatzel

[57] ABSTRACT

In a computer system, a method for an area based place and route of an integrated circuit layout that provides automatic iterative area placement of module cells intelligently and effectively. In one embodiment, this is accomplished in three phases. The searching phase determines which hot spot is to be refined based on a congestion map. Next, the refining phase chooses a box with the proper aspect ratio, cut line direction, and placement options for minimizing the hot spot. The scheduling phase then decides whether to proceed with another area placement based on the current result or to restore a previous placement that exhibited superior characteristics. In the course of the area placements, several parameters are randomly varied in an intelligent manner so that successive iterative area placements produce equivalent or better results. All of this is accomplished without human intervention or expert knowledge. Instead, the computer system continuously runs its program until a design goal is attained.

8 Claims, 7 Drawing Sheets

METHOD FOR AUTOMATIC ITERATIVE AREA PLACEMENT OF MODULE CELLS IN AN INTEGRATED CIRCUIT LAYOUT

FIELD OF THE INVENTION

The present invention pertains to a method for the automatic iterative area placement of module cell in a IC semiconductor layout.

BACKGROUND OF THE INVENTION

Advances in semiconductor technology have led the way towards more versatile, powerful, and faster integrated circuit (IC) chips in the fields of computer systems, telecommunications, instrumentation, etc. The trend is towards even larger, more complex and sophisticated IC chips in an effort to meet and improve upon the demands imposed by state-of-the-art performance. Today, a single IC chip can contain upwards of millions of transistors. As the complexity, functionalities, speed, and size of these chips increase, it is becoming a much more critical and difficult task to properly design, layout, and test the next generation of chips.

In order to meet these demands, a highly specialized field, commonly referred to as "electronic design automation" (EDA), has evolved, whereby computers are extensively used to automate the design, layout, and testing process. Indeed, it has now come to the point where the process has become so overwhelming that integrated circuits cannot be designed without the help of computer-aided design (CAD) systems. Computers are ideally suited to these tasks because they can be programmed to reduce or decompose large, complicated circuit designs into a multitude of much simpler functions. Whereupon, the computers can be programmed to iteratively solve these much simpler functions.

Typically, the process begins with an engineer defining the input/output signals, desired functionalities, and performance characteristics of the new IC chip. This information is fed into a logic synthesis program which generates a specification defining the integrated circuit in terms of a particular semiconductor technology (e.g., very large scale integration—VLSI). This specification can be regarded as a template for the realization of the physical embodiment of the integrated circuit in terms of transistors, routing resources, etc. Next, a place and route CAD tool is used to determine the routing, pinouts, wiring, interconnections and general physical layout of the chip.

One common method used in the place and route of a chip involves a grid-based channel approach. In this approach, the routing area (i.e., the channel) of the chip is adjusted according to the demands imposed by the functionality and routing requirements. In other words, the channel is widened if additional routing resources are required. And conversely, the channel can be shrunk to eliminate excess routing capacity. The size of the layout is determined only at the completion of the overall process. Of course, the disadvantage to this grid-based channel process is that it is extremely difficult for the designer to control the size or area of the silicon die. The human designer has minimal control over the die size and must accept whatever is generated by the channel router.

An alternative method for the place and route of a semiconductor chip is that of an area-based approach. In an area-based approach, a specific area of silicon is pre-specified. The software then attempts to layout the design within this given size constraint. Often, quadratic programming is applied to place the circuit of all module cells. This approach works fairly well for simple layouts. However, problems may be encountered with larger, more complex layouts requiring denser circuitry. The problem is that there may be certain sections which require higher amounts of routing resources. For example, data path circuitry require more routing resources versus decoder circuitry, which tend to be more locally connected. As a result, layouts tend to have sections with high concentrations of overlapping interconnections. These "clusters" or "hot spots" are highly undesirable. Sometimes, the congestion within a hotspot is so severe that it becomes physically impossible to complete the routing of nets. And even if it were possible to route all of the nets, it might require an extraordinary amount of processing power, time, and skill in order to finally achieve the objective.

It is highly desirable to more evenly distribute or spread out the routing so as to minimize hot spots. Consequently, many state-of-the-art layout systems provide an "area placement" option which allows designers to manually select particular areas and set placement options to refine the placement of module cells within those selected areas. Thereby, designers can manually intervene in the layout process in an attempt to minimize the hotspot areas. FIG. 1 shows a usage flow of a typical prior art placer. In step 101, the designer selects a particular area of interest. Next, the designer judiciously sets the placement options, step 102. Based thereon, the software program performs area placement, step 103, and also a whole design placement, step 104. Afterwards, the designer examines the results and decides whether it is acceptable. If the result does not meet the design criteria, the process must be repeated. It is not uncommon for a small, complex IC design to take approximately ten to twenty separate area placements with placement options properly set before the module cell placement becomes refined to a routable level.

Clearly, this manual area placement option is extremely labor-intensive, tedious, and time-consuming. Furthermore, it requires a highly skilled designer with specialized knowledge and a vast amount of practical experience. It takes intensive training to become an expert in performing area placement correctly, efficiently and effectively. First, the designer must be able to identify hot spots from the placement of cells. The designer must then find the box containing a hot spot within which module cells are to be placed. Next, the designer must properly set the placement congestion removal option to perform area placement. Finally, the designer must select cut line directions for the placement to proceed. This process is repeated over and over again many times. And each time that the process is performed, it can take the computer many minutes or even hours to execute. In the meantime, this highly paid designer is idle and must wait for the outcome.

Therefore, there is a great need in the prior art for some mechanism that could somehow relieve the burden of area placement from human designers. The present invention provides a solution to this problem that is inexpensive and yet highly effective. The present invention accomplishes this feat by applying a computer-implemented process which performs automatic iterative area placement of module cells in an IC layout without human interaction.

SUMMARY OF THE INVENTION

The present invention pertains to a computer implemented method for an area based place and route of an integrated circuit layout that provides automatic iterative area placement of module cells. Rather than having a skilled human having expert knowledge performing the task of area placement, the present invention accomplishes the same function automatically under software guidance. There are a number of different ways in which the present invention of an automatic area placement can be implemented. In one embodiment, this is accomplished in three phases. The searching phase determines which hot spot is to be refined based on a congestion map. The congestion map contains routing information. A grid is then overlaid on top of the congestion map. Those grids having a high degree of congestion is designated as being hot grids. Groups of abutting hot grids are designated as being hot spots. A hot spots is then selected for refinement. The selection is randomly based on intelligently varying certain parameters so that successive area placements produce different results. In the refining phase, a box containing the selected hot spot is chosen. The computer system automatically sets the proper aspect ratio, cut line direction, and placement options for minimizing the hot spot. Finally, the scheduling phase decides whether to proceed with another area placement based on the current result or to restore a previous placement that exhibited superior characteristics so that successive iterative area placements produce equivalent or better results. In the present invention, all of this is accomplished without human intervention. Instead, the computer system continuously runs its program until a design goal is attained.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An automatic iterative area placement of module cells in an IC layout is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention. It should be noted that the present invention is capable of performing whole design placement of module cells or placement within a given area.

Figure 1:
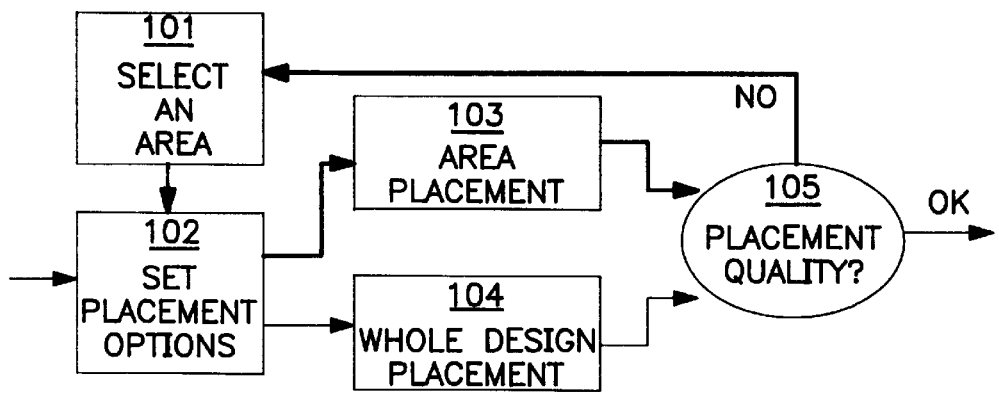
FIG. 1 shows a usage flow of a typical prior art placer.
Figure 2:
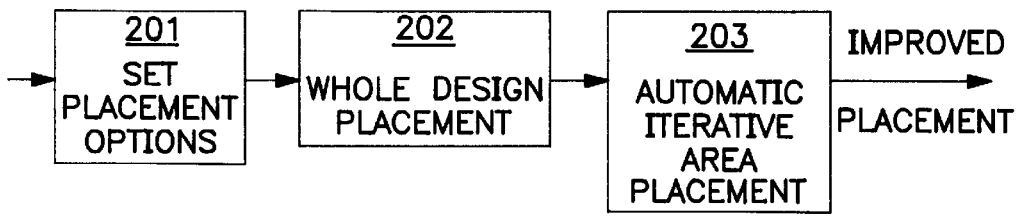
FIG. 2 shows a computer-implemented placement usage flow according to the present invention.

FIG. 2 shows a computer-implemented placement usage flow according to the present invention. In step 201, the placement options are set. Next, the whole design placement is constructed, step 202. Finally, an automatic iterative area placement is performed, step 203. Note that there is no need for human intervention, nor is there a requirement for the process to be manually repeated. Instead, the computer system automatically finds the most optimal area placement. When finished, the computer system notifies the human designer of the completed layout. Thus, there is no need for the designer to have any expert knowledge in identifying hot spots, defining boxes, setting congestion options, etc. With the present invention, the designer simply inputs the initial conditions and hits a button to start the process. From thereon, the computer system automatically performs the area placement. Thus, with the present invention, any general user can confidently, reliably, and effectively perform area placement without having to know area selection or placement option setting.

The currently preferred embodiment of the present invention consists of the following three phases: searching, refining, and scheduling. Basically, the searching phase determines which hot spot is to be refined. This determination is based on a congestion map created by the placement engine. The refining phase then chooses a box with the proper aspect ratio, cut line directions, and placement options that is appropriate for the selected area to be refined. Lastly, the scheduling phase decides whether the area placement should be repeated again. This determination is based on comparing the current result against the best prior placement which was memorized during the refining phase.

Figure 3:
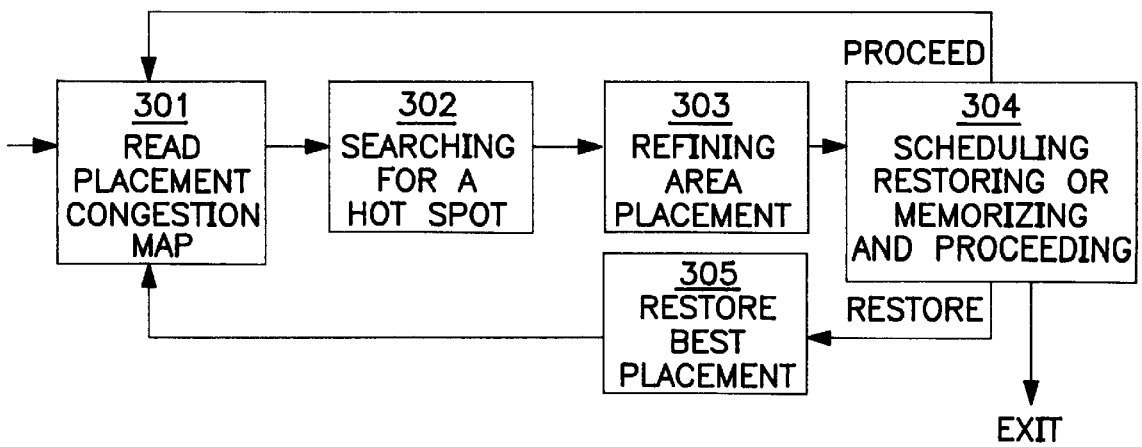
FIG. 3 shows a more detailed flowchart describing the steps for performing the automatic iterative area placement flow according to the currently preferred embodiment of the present invention.

FIG. 3 shows a more detailed flowchart describing the steps for performing the automatic iterative area placement flow according to the currently preferred embodiment of the present invention. Initially, the computer system reads the placement congestion map, step 301. The congestion map is generated by the placement engine. Based on the congestion map, the computer system searches for a hot spot, step 302. Once a hot spot has been determined, the hot spot and its surrounding area is then refined, step 303. After refinement has been completed, the scheduling phase is performed, step 304. In the scheduling phase, a decision is made as to whether it is better to proceed with further area placement or to restore a previous placement. If the decision is to proceed, then the process is repeated at step 301. Otherwise, the best prior placement is restored, step 305, and the process repeats again at step 301. After a predetermined number of iterations or a runtime limit until a desired goal has been attained, the process exits. Each of the searching, refining, and scheduling phases are now described in detail below.

Figure 4:
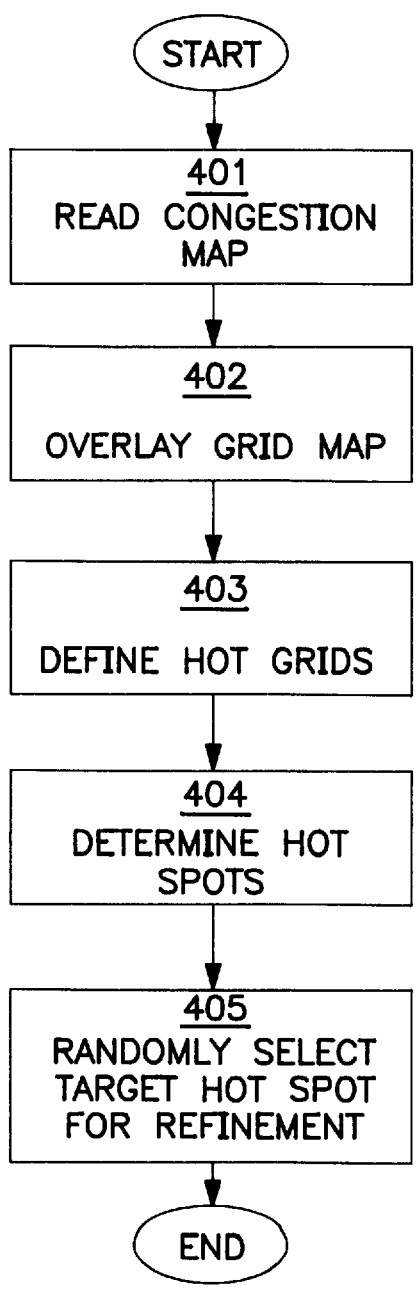
FIG. 4 is a flowchart describing the steps for the searching phase.

FIG. 4 is a flowchart describing the steps for the searching phase. First, the searching phase starts with the reading of a congestion map, step 401. The congestion map is a two-dimensional display of the routing for a particular placement. The core area is partitioned into a two-dimensional array of grids. The grids, also known as buckets or bins, contain an N×M number of routing tracks (e.g., wires), extending in both horizontal and vertical directions. The size of the grids is randomly set within a design-dependent range. This randomness of the grid size is purposely made to vary the cut line location. The grid map is then overlapped on top of the congestion map, step 402. If a grid contains congestion judged by a chosen threshold, the grid is defined to be a "hot" grid, step 403. This threshold is also randomly varied within a preset range in order to provide a degree of variation of the congestion resolution. Once the hot grids have been defined, a hot spot is found in step 404 by grouping a number of hot grids that abut one another either on top, bottom, left, or right edge boundaries. This can be achieved by visiting neighboring hot grids recursively while preventing revisiting.

After all hot spots have been identified, a particular hot spot is randomly selected as the target hot spot to resolve within the current iteration, step 405. The probability of selection of a hot spot is weighted according to its particular size. Larger hot spots have a higher probability of being selected as a target hot spot. However, it is important to give smaller hot spots a chance of being selected so that they can also be improved upon. In the currently preferred embodiment, all M hot spots are sorted based upon their area and a probability of P is imposed on the number N hot spot, in which P is given as:

$$P = \frac{1/N}{\sum_{n=1}^{M} 1/n}$$

For example, if M=5, then the probability of getting selected as the target hot spot is 44%, 22%, 14%, 11%, and 9% for each hot spot as sorted by their respective sizes.

Figure 5:
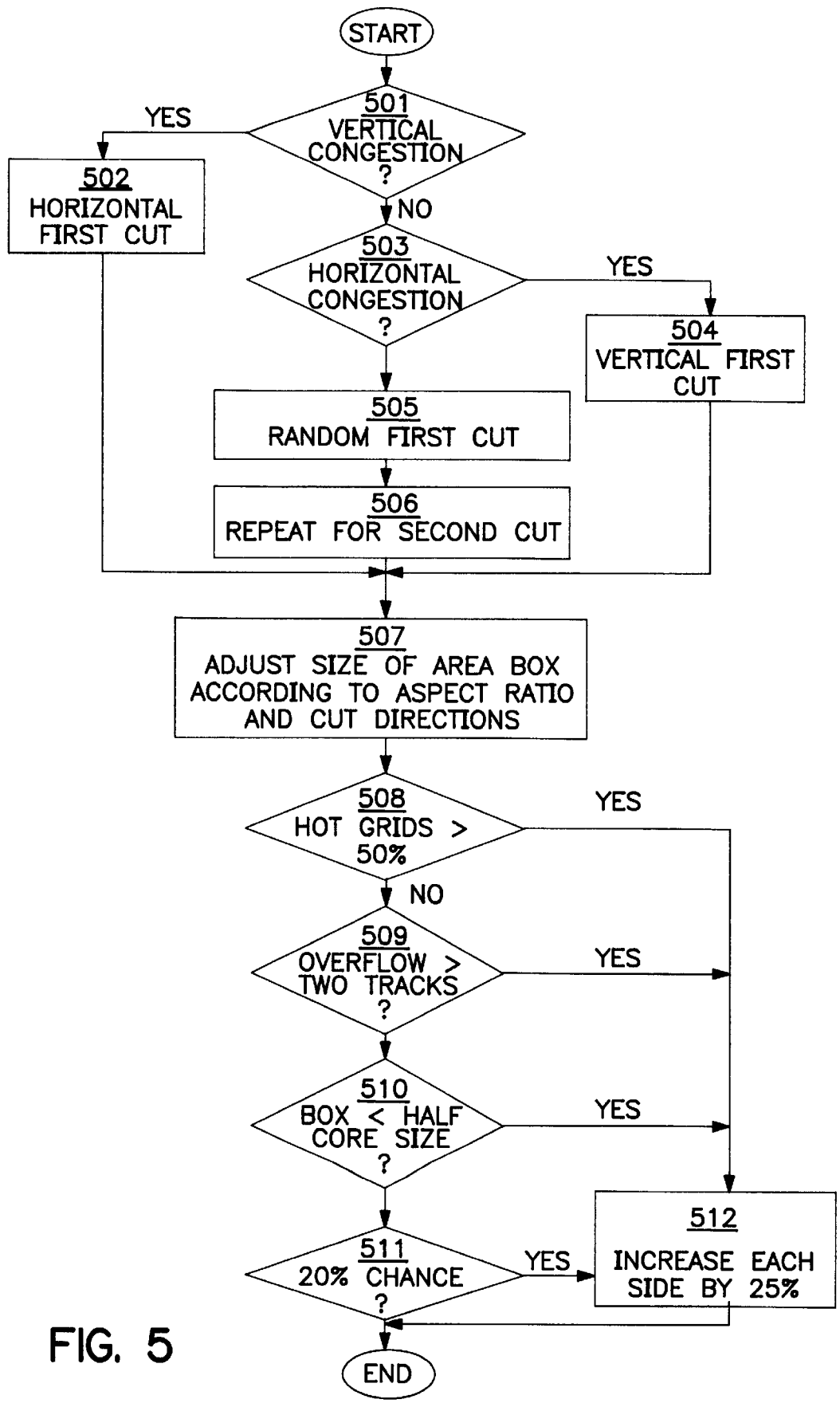
FIG. 5 is a flowchart describing the steps for the refining phase.

FIG. 5 is a flowchart describing the steps for the refining phase. Basically, the refining phase performs two functions: (1) determining first and second cut line directions and (2) finding a box to contain the target hot spot. The cut line direction is determined as follows. It is known that the congestion map contains both vertical and horizontal routing congestion information. For vertical congestion, the placement engine calls for a horizontal first cut to reduce vertical congestion, steps 501–502, and vice versa for horizontal congestion, steps 503–504. By analyzing the target hot spot, the computer system can determine which direction is more congested. Assume that V and H represent the congestion cost (e.g., the number of tracks) of vertical and horizontal congestion. If (V>1.2*H), then the first cut is chosen to be horizontal. Likewise, if (H>1.2*V), then the first cut is chosen to be vertical. Otherwise, the first cut direction is randomly selected between vertical and horizontal directions, step 505. Furthermore, if (V>2*H), then the second cut is also horizontal, and if (H>2*V), then the second cut is also vertical, step 506.

The area box is determined as follows. Basically, the bounding box of the hot spot is found to be the initial area box. The following adjustments to the initial area box are done to optimize the selection, step 507. Assume that R represents the aspect ratio of the area box, where R=Y/X, with Y being the height of the box and X being the width of the box. If the first cut is horizontal and R<1, then Y is increased to make R=1. If the first cut is vertical and R>1, then X is increased to make R=1. If the second cut is also horizontal, same as the first cut, Y is further increased so that R=1.5. Likewise, if the second cut is also vertical, same as the first cut, X is further increased so that R=0.67. The area box is then extended by one grid on the top, bottom, left, and right boundaries. If one of the following four conditions is true, the area box is expanded by 25% on each side according to step 512:

1) Hot grids comprise more than 50% of all grids in the current area box (step 508);

2) Average overflow of more than two tracks for each global routing cell (GRC) in a grid (step 509);

3) The current area box is smaller than half of the core box in both dimensions (step 510); and 4) Twenty percent random chance to expand the box (step 511).

The area box after adjustment is centered at the target hot spot. If the selected area box is not fully inside the core area box, the area box is shifted such that it is fully inside the core area box.

In addition to the first and second cut directions, which are placement options, the computer system also switches between two congestion-driven options of the placement engine: "padding" and "spacing." There are situations where the spacing option is used rather than the padding option. First, spacing is used if there are region constraints in the design. Second, spacing is used if the selected box overlaps with no less than one macro block. And third, spacing is used in 50% of chance by random probability. Otherwise, the padding option is used.

Figure 6:
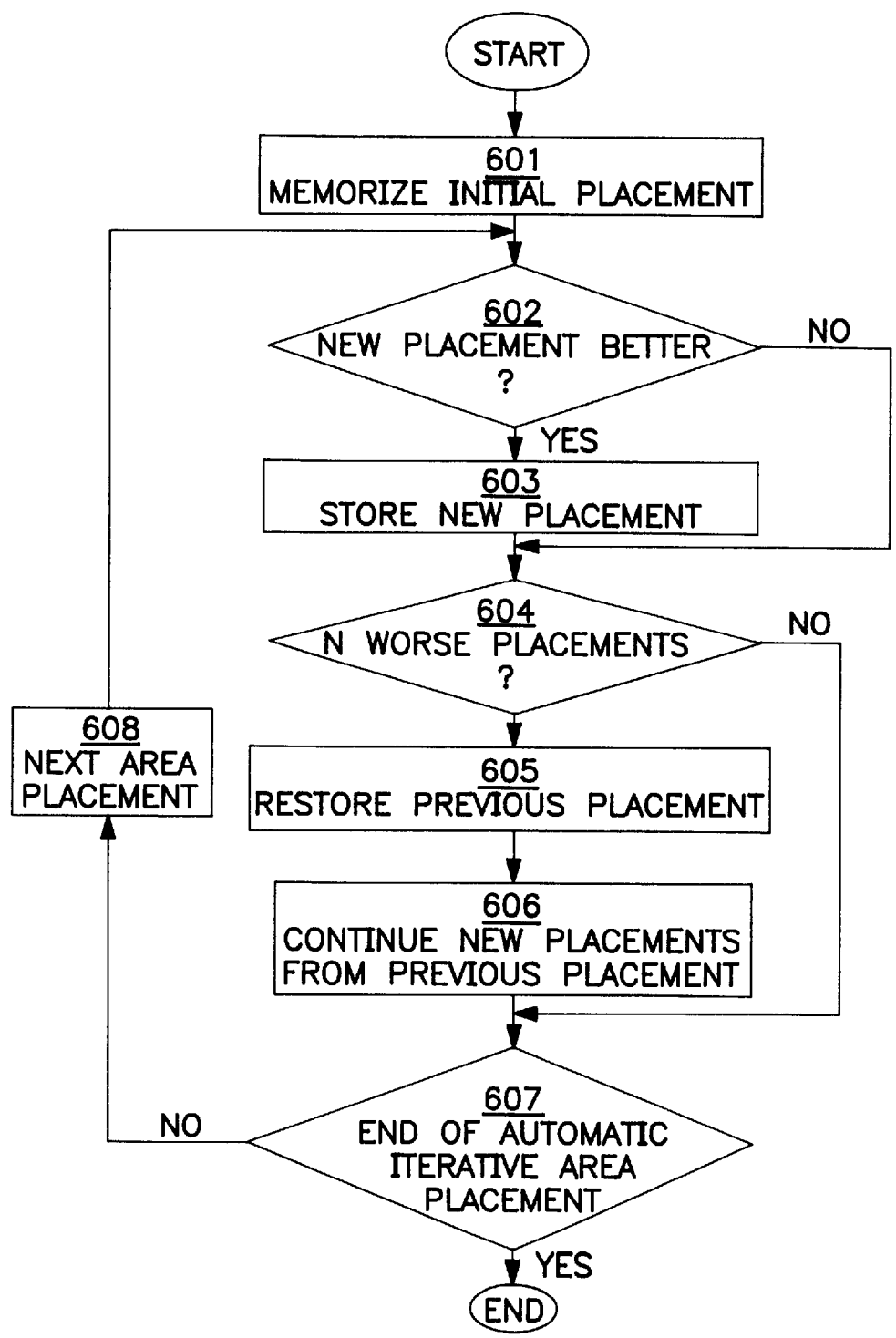
FIG. 6 is a flowchart describing the steps for the scheduling phase.

The scheduling phase is now described in detail with reference to the flowchart of FIG. 6. The scheduling phase is performed because of the fact that not all area placement results in a better placement than that which has existed before. Thus, the scheduling phase takes the following steps to memorize the best placement. The term "best" is defined by a number called "total GRC overflow" when a congestion map is updated or created. First, the initial placement is memorized, step 601. A comparison is made between the new placement and the prior best placement, step 602. If the next area placement iteration results in a better placement, that new placement is memorized (e.g., stored into computer memory) as being the best, step 603. If it is determined in step 604 that for consecutive N area placements, all of which result in worse placement than the previously memorized best placement, the memorized best placement is restored, step 605. Thereupon, the area placement continues with its processing according to the newly restored best placement, step 606. This process is repeated until the end of the automatic iterative area placement is achieved, steps 607–608.

It should be noted that the restoration of the placement does not result in repetition of history because a random number generator is widely used in the present invention in both the searching and refining phases. Hence, a different hot spot, a different box size, and/or different placement options may be used for subsequent placements which differ from those of previous placements. Thereby, additional placements will gradually produce better and better results rather than worse results. In this manner, the memorizing and restoration of the best placement enables the drastic improvement on placement quality, which is based on the total GRC overflow. Because of the scheduling phase, users always get an equivalent (in a worst case scenario) or a much better placement (in most other cases) at the end of the automatic iterative area placement.

Figure 7:
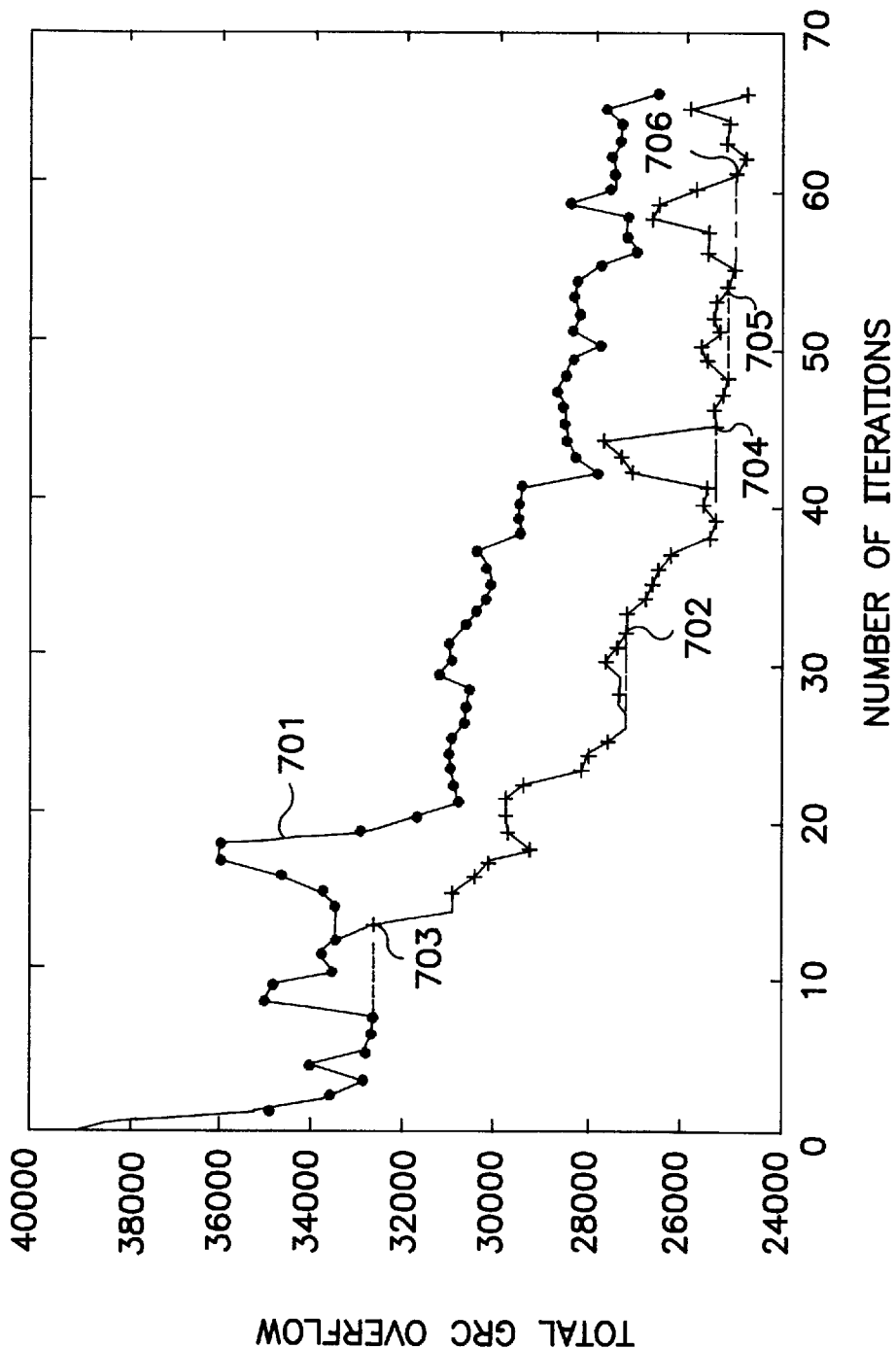
FIG. 7 shows a sample chart of the total GRC overflow as a function of the number of iterations performed.

FIG. 7 shows a sample chart of the total GRC overflow as a function of the number of iterations performed. The top plot 701 shows the case where scheduling is not applied. Whereas, the bottom plot 702 has the benefit of the scheduling enhancement. It can be seen that there are peaks and valleys. Sometimes successive iterations reduce the total GRC overflow, whereas other times the total GRC overflow is actually increased or worsened. In this example, there are four instances 703–706 where a successive area placement is worse than a previous area placement. In these instances, a rollback operation is performed to rollback the area placement so that it is better.

In the currently preferred embodiment, there are four criteria to stop the searching and refining phases:

1) Set total number of areas to search and refine;

2) Set total run time limit;

3) Set maximum overflowing GRC number; and

4) Set overflowing GRC percentage.

If either one of these four holds true, the process stops and the best placement memorized is restored.

Figure 8:
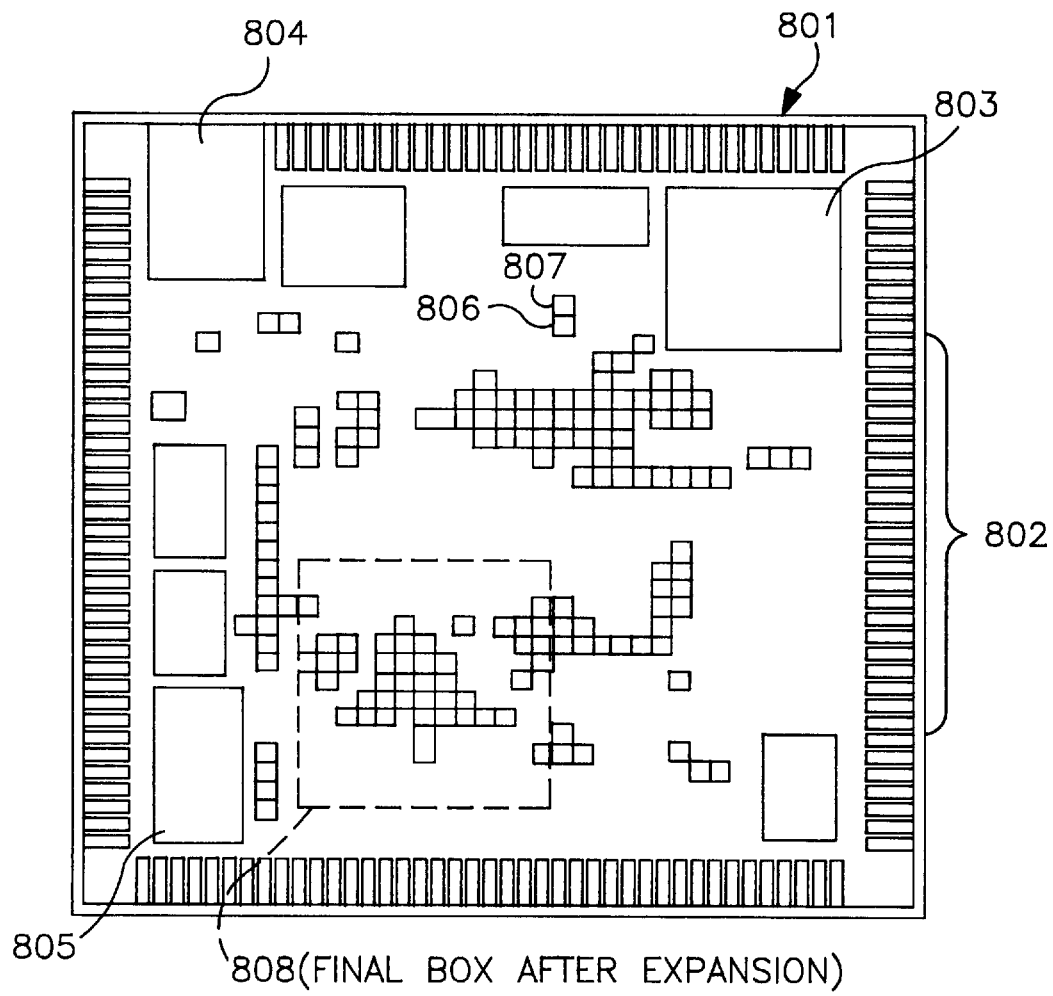
FIG. 8 shows an example of a congestion map.

FIG. 8 shows a typical congestion map 801. The congestion map 801 contains a number of peripheral input/output (I/O) cells 802 and some macrocells 803–805. Other circuitry is placed in a host of module cells within the remaining silicon area. Certain areas which have high degree of congestion are represented by small squares, known as "hot grids." For example, a small area of congestion is represented by the two hot grids 806 and 807. Based on the hot grids, the computer system selects a box to encompass the surrounding regions of a particular hot spot. An example of such a bounding box is shown as 808. Area placement is performed within the bounding box 808. Once the box is determined, the computer system must decide whether to make the first cut in a horizontal or vertical direction. In this example, a horizontal cut is shown. Refinement is then performed on this box 808.

Figure 9:
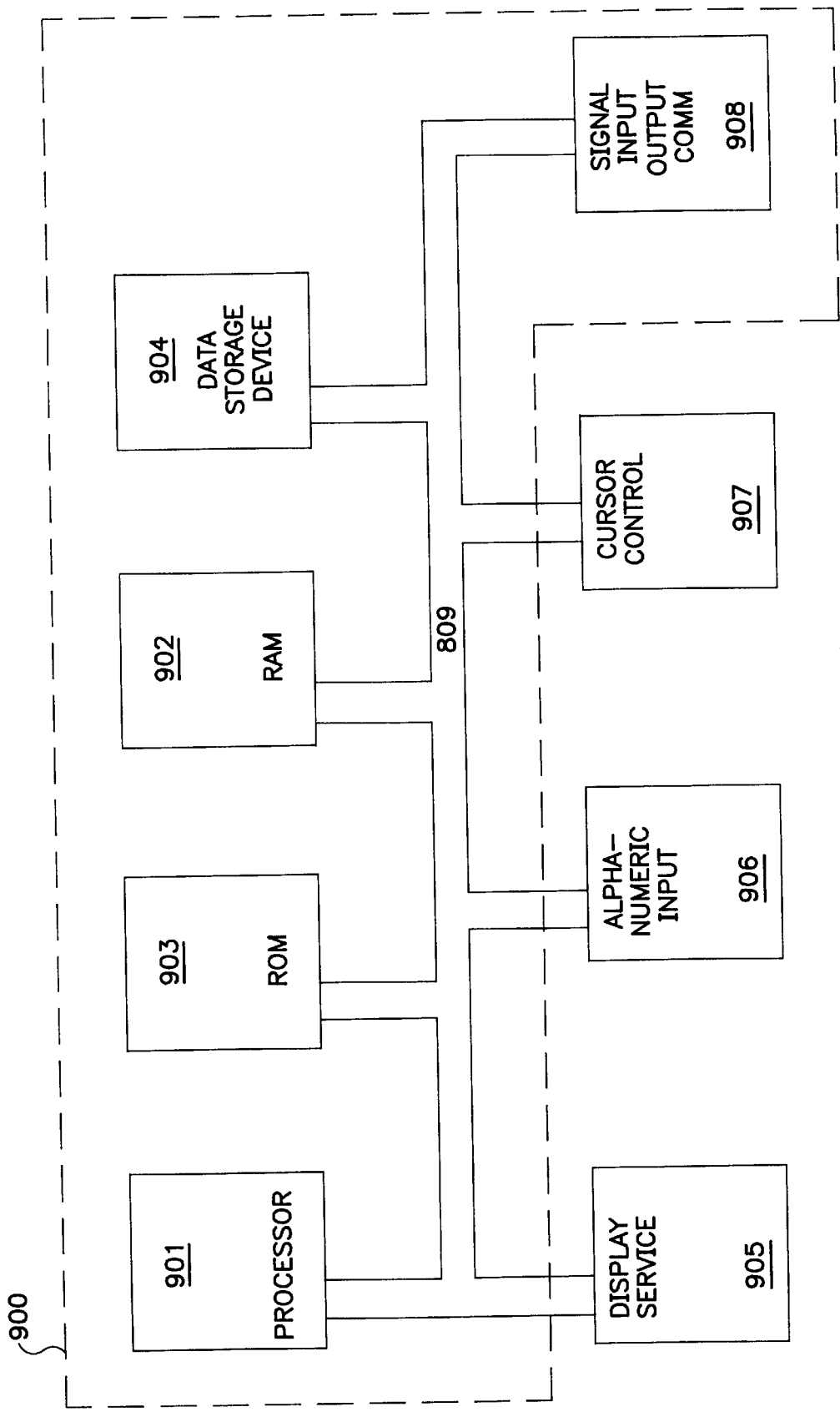
FIG. 9 illustrates an exemplary computer system upon which the present invention may be implemented or practiced.

FIG. 9 illustrates an exemplary computer system 900 upon which the present invention may be implemented or practiced. It is appreciated that the computer system 900 of FIG. 9 is exemplary only and that the present invention can operate within a number of different computer systems including general purpose computers systems, embedded computer systems, and computer systems specially adapted for electronic design automation. Computer system 900 of FIG. 9 includes an address/data bus 909 for conveying digital information between the various components, a central processor unit (CPU) 901 for processing the digital information and instructions, a random access memory (RAM) 902 for storing the digital information and instructions, a read only memory (ROM) 903 for storing information and instructions of a more permanent nature. In addition, computer system 900 may also include a data storage device 804 (e.g., a magnetic, optical, floppy, or tape drive) for storing vast amounts of data, and an I/O interface 908 for interfacing with peripheral devices (e.g., computer network, modem, etc.). Devices which may be coupled to computer system 900 include a display device 905 for displaying information (e.g., channel grid map, vertical constraint graphs, weighting functions, feasible links, etc.) to a computer user, an alphanumeric input device 906 (e.g., a keyboard), and a cursor control device 907 (e.g., mouse, trackball, light pen, etc.) for inputting data and selections.

Thus, an automatic iterative area placement of module cells in an IC layout is described. The present invention successfully replaces the knowledge of an expert who sits in front of a workstation and does box selection, option setting repetitively one area after another. The present invention greatly facilitates the useability of the tools for general users in achieving the same or even better results that an expert could get. Moreover, the present invention saves the expert precious time from sitting in front of the workstation or waiting for the results of each successive iteration. In short, the present invention offers a huge improvement in useability of tools for all users and in minimizing congestion for the layout of IC's.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A computer-implemented automation tool for automatic area placement in designing circuit layouts for semiconductor integrated circuits, comprising:

a computer platform for processing a plurality of program execution modules which accept a set of placement options and initial conditions related to a semiconductor integrated circuit design, computes an area placement solution, and that outputs a completed layout that is used as a guide for the fabrication of a semiconductor integrated circuit;

a first computer process for searching in an area-placement-solution computation for a hot-spot candidate with a relatively high concentration of overlapping connections for further refining, and for loading and execution on the computer platform as one of said program execution modules;

a second computer process for refining said hot-spot candidate by matching it with an area box having a particular combination of aspect ratio, cut-line direction, and placement options, and for loading and execution on the computer platform as one of said program execution modules; and a third computer process connected to receive a plurality of refined ones of said hot-spot candidates, for scheduling area-placement-solution-computation repetitions, and for loading and execution on the computer platform as one of said program execution modules.

2. A computer-implemented automation tool for automatic area placement in designing circuit layouts for semiconductor integrated circuits, comprising:

a placement engine that calls for horizontal cuts to reduce vertical congestion and vertical cuts to reduce horizontal congestion, and providing for a generating of a plurality of placement congestion maps for a circuit layout for a semiconductor integrated circuit, wherein each of said placement congestion maps is a two-dimensional routing display for a particular placement and contains both vertical and horizontal routing congestion information;

a search mechanism providing for an identification within said plurality of placement congestion maps of a target hot-spot candidate with a relatively high concentration of overlapping connections;

a refining mechanism providing for a refined target hot-spot from said identified target hot-spot candidate and a surrounding adjacent area; and a scheduling mechanism providing for a decision whether to proceed with a placement solution that includes said refined target hot-spot candidate and then repeat, or to restore a previous placement solution and then repeat, and wherein said decision is based on at least one of a count of a number of iterations, a run-time limit, and an attained placement goal.

3. The automation tool of claim 2, wherein:

the search mechanism further provides for partitioning a core area into a two-dimensional array of grids that are randomly sized within a design-dependent range to vary a cut line location, and that each contain an N×M array of routing tracks; and the search mechanism also provides for a grid map comprising said two-dimensional array of grids that is overlapped on top of at least one of said plurality of placement congestion maps to judge if any grid includes a hot-grid that is defined to be one that exceeds a congestion-threshold variable.

4. The automation tool of claim 3, wherein:

the search mechanism further provides for finding a plurality of hot-spots by grouping for each a plurality of said hot-grids that abut one another on a boundary edge.

5. The automation tool of claim 2, wherein:

the refining mechanism further includes determining a first and a second cut-line direction, and finding an area box to contain said target hot-spot;

wherein, said first and a second cut-line directions are each determined by analyzing a target hot-spot to determine a more-congested direction; and wherein, said area box is determined by starting with initial area box equal to a bounding box for a hot spot, and adjusting for a first cut at least one of a height (X) and a width (Y) dimension of said initial area box to achieve a first particular aspect ratio of said width and a height dimensions (R=Y/X), and if a first and a second cut are in a same direction, adjusting for at least one of a height (X) and a width (Y) dimension of said initial area box to achieve a second particular aspect ratio of said width and a height dimensions (R=Y/X).

6. The automation tool of claim 5, wherein:

the refining mechanism further includes additional expansion of said initial area box if;

more than half of all grids in a current area box are hot grids;

there is an average overflow of more than two tracks for each global routing cell in a grid;

a current area box is smaller than half of said core box in two dimensions; or there is at least twenty percent random chance to expand said initial area box;

wherein, an objective of an area box adjustment is centered at the target hot spot. If the selected area box is not fully inside the core area box, the area box is shifted such that it is fully inside the core area box.

7. The automation tool of claim 2, wherein:

the searching mechanism further provides for a comparison between a current placement and at least one previous placement, and that then provides for a retention of one of said current and previous placements as being a best placement depending on a total global-routing-cell overflow value associated with each placement when a congestion map is processed.

8. A computer-implemented method for automatic area placement in designing circuit layouts for semiconductor integrated circuits, comprising the steps of:

computer processing a plurality of program execution modules which accept a set of placement options and initial conditions related to a semiconductor integrated circuit design, and that then compute an area placement solution, and output a completed layout for use as a fabrication guide for a semiconductor integrated circuit;

using one of one of said program execution modules to search in an area-placement-solution computation for a hot-spot candidate with a relatively high concentration of overlapping connections for further refining;

using one of one of said program execution modules to refine said hot-spot candidate by matching it with an area box having a particular combination of aspect ratio, cut-line direction, and placement options; and using one of one of said program execution modules to receive a plurality of refined ones of said hot-spot candidates and schedule area-placement-solution-computation repetitions.

* * * * *